United States Patent
Gomez Gomez et al.

(10) Patent No.: US 11,385,288 B2
(45) Date of Patent: Jul. 12, 2022

(54) DEVICE, METHOD AND SYSTEM OF ERROR DETECTION AND CORRECTION IN MULTIPLE DEVICES

(71) Applicant: STMICROELECTRONICS SA, Montrouge (FR)

(72) Inventors: Ricardo Gomez Gomez, Grenoble (FR); Sylvain Clerc, Grenoble (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 17/031,716

(22) Filed: Sep. 24, 2020

(65) Prior Publication Data

US 2021/0096183 A1 Apr. 1, 2021

(30) Foreign Application Priority Data

Sep. 27, 2019 (FR) ...................... 1910707

(51) Int. Cl.
| | |
|---|---|
| *G01R 31/317* | (2006.01) |
| *G01R 31/3185* | (2006.01) |
| *G06F 11/16* | (2006.01) |
| *G06F 11/267* | (2006.01) |
| *G01R 31/319* | (2006.01) |
| *G01R 31/3193* | (2006.01) |
| *G06F 11/18* | (2006.01) |

(52) U.S. Cl.
CPC . *G01R 31/31926* (2013.01); *G01R 31/31716* (2013.01); *G01R 31/31935* (2013.01); *G01R 31/318566* (2013.01); *G06F 11/1629* (2013.01); *G06F 11/1645* (2013.01); *G06F 11/183* (2013.01); *G06F 11/267* (2013.01)

(58) Field of Classification Search
CPC ........ G01R 31/318566; G01R 31/3177; G01R 31/31816; G06F 11/1629; G06F 11/183; G06F 11/267; G06F 11/0751
See application file for complete search history.

(56) References Cited

U.S. PATENT DOCUMENTS

| | | | |
|---|---|---|---|
| 6,892,345 B1 * | 5/2005 | Ghameshlu | G06F 11/1679 327/141 |
| 6,928,606 B2 * | 8/2005 | Savaria | G01R 31/318536 714/729 |
| 6,941,498 B2 * | 9/2005 | Hartano | G01R 31/31705 714/729 |
| 7,013,414 B2 * | 3/2006 | Takeshige | G11C 29/40 714/719 |
| 7,036,059 B1 * | 4/2006 | Carmichael | G06F 11/1004 714/725 |
| 2001/0038304 A1 | 11/2001 | Waldie et al. | |
| 2005/0154947 A1 | 7/2005 | Taniguchi | |

(Continued)

*Primary Examiner* — Cynthia Britt
(74) *Attorney, Agent, or Firm* — Seed IP Law Group LLP

(57) ABSTRACT

A method tests at least three devices, each device including a test chain having a plurality of positions storing test data. The testing includes comparing test data in a last position of the test chain of each of the devices, and shifting test data in the test chains of each of the devices and storing a result of the comparison in a first position of the test chains of each of the devices. The comparing and the shifting and storing are repeated until all the stored test data has been compared. The at least three devices may have a same functionality and a same structure.

28 Claims, 3 Drawing Sheets

(56) References Cited

U.S. PATENT DOCUMENTS

| | | | |
|---|---|---|---|
| 2006/0242508 A1* | 10/2006 | Simpson | G01R 31/318563 714/726 |
| 2007/0028157 A1 | 2/2007 | Drake et al. | |
| 2008/0086666 A1* | 4/2008 | Kawamura | G01R 31/318544 714/729 |
| 2009/0049348 A1* | 2/2009 | Iwai | G11C 29/1201 714/718 |
| 2010/0088565 A1 | 4/2010 | Chandra | |
| 2016/0116532 A1* | 4/2016 | Dong | G01R 31/318563 714/727 |

* cited by examiner

DEVICE, METHOD AND SYSTEM OF ERROR DETECTION AND CORRECTION IN MULTIPLE DEVICES

BACKGROUND

Technical Field

The present disclosure generally concerns the detection and the correction of errors in an electronic device, and more particularly a method of error detection and correction by comparison of electronic devices. The present disclosure further concerns a device enabling to implement such an error detection and correction method in an electronic device.

Description of the Related Art

The use, in an electronic device, of electronic devices, such as processors, microprocessors, integrated systems, memories, etc., is more and more submitted to performance and reliability constraints. To comply with certain standards and/or with a quality charter, such devices are generally coupled with error detection and/or correction devices. Indeed, operating errors may come up on execution of one of these devices and disturb their operation and/or the general operation of the electronic system comprising them.

Several types of errors, or faults, may occur within an electronic device. As an example, certain errors (SPF, Single Point Fault) directly cause a violation of a safety goal. This safety goal is generally based on a specification, for example the ISO26262 specification regarding safety systems. Such errors are easily recognizable by observation of the device and/or of the system. Other errors, called latent errors (LFM, Latent Fault Metric), do not instantaneously cause a malfunction, but may cause one, for example, later on, or when they are combined with other errors. Such errors are more difficult to detect, and thus to correct, since a simple observation of the device or system operation is generally not sufficient.

BRIEF SUMMARY

An embodiment facilitates overcoming all or part of the disadvantages of known error detection and correction methods and devices implementing such a method.

In an embodiment, a method comprises: testing at least three devices, each device including a test chain having a plurality of positions storing test data, the testing including: comparing test data in a last position of the test chain of each of the devices; shifting test data in the test chains of each of the devices and storing a result of the comparison in a first position of the test chains of each of the devices; and repeating the comparing and the shifting and storing until all the stored test data has been compared. In an embodiment, each piece of test data is stored in a test point. In an embodiment, the test points are registers or flip-flops. In an embodiment, the test data are binary words. In an embodiment, the test data all are binary words of same size. In an embodiment, the test data are binary words of different sizes. In an embodiment, the devices each comprise a plurality of test chains. In an embodiment, the method comprises testing more than three devices. In an embodiment, the at least three devices have a same structure and a same function. In an embodiment, the result of the comparison is a value stored in the last position of a test chain of two or more of the at least three devices prior to the shifting.

In an embodiment, a device comprises: a comparator; and control circuitry coupled to the comparator, wherein the control circuitry, in operation, controls testing of at least three electronic circuits, each electronic circuit including a test chain having a plurality of positions storing test data, the testing including: comparing test data in a last position of the test chain of each of the electronic circuits; and shifting test data in the test chains of each of the electronic circuits and storing a result of the comparison in a first position of the test chains of each of the electronic circuits, wherein the comparing and the shifting and storing are repeated until all the stored test data has been compared. In an embodiment, the control circuitry comprises at least three feedback loops, each coupling an output of the comparator and an input of the test chain of one of the three electronic circuits. In an embodiment, each feedback loop comprises a multiplexer.

In an embodiment, a system comprises: at least three electronic devices, each including a test chain having a plurality of positions storing test data; and testing circuitry, which, in operation, tests the at least three electronic devices, the testing including: comparing test data in a last position of the test chain of each of the at least three electronic devices; and shifting test data in the test chains of each of the at least three electronic devices and storing a result of the comparison in a first position of the test chains of each of the devices, wherein the comparing and the shifting and storing are repeated until all the stored test data has been compared. In an embodiment, each piece of test data is stored in a test point of a test chain. In an embodiment, the test points are registers or flip-flops. In an embodiment, the test data are binary words. In an embodiment, the test data all are binary words of same size. In an embodiment, the test data are binary words of different sizes. In an embodiment, the electronic devices each comprise a plurality of test chains. In an embodiment, the at least three electronic devices have a same structure and a same functionality. In an embodiment, the testing circuitry comprises a comparator and a plurality of feedback loops coupling one or more outputs of the comparator to inputs of the testing chains. In an embodiment, the result of the comparison is a value stored in the last position of a test chain of two or more of the at least three devices prior to the shifting.

An embodiment provides an error detection and correction method comprising comparing at least three functionally identical devices, each comprising at least one chain of test data, comprising the following steps: (a) the test data in the last position in said chain of said at least three devices are compared; (b) the other test data are shifted forward by one position in their chain; (c) the result of the comparison of step is written in the first position in said chain, steps (a), (b), and (c) are repeated until all the test data of said chains are compared.

According to an embodiment, each piece of test data is stored in a test point.

According to an embodiment, the test points are registers or flip-flops.

According to an embodiment, the test data are binary words.

According to an embodiment, the test data all are binary words of same size.

According to an embodiment, the test data are binary words of different sizes.

According to an embodiment, the devices each comprise at least two chains of test data.

According to an embodiment, the method is a method of comparison of more than three identical electronic devices.

Another embodiment provides a device of comparison adapted to execute the method described above.

According to an embodiment, the device is a device of comparison of at least three identical electronic devices each comprising at least one chain of test data, comprising: a comparator circuit; and at least three feedback loops, each coupling an output of the comparator circuit and an input of one of said test chains.

According to an embodiment, each feedback loop couples an output of the comparator circuit and an input of one of said chains via a multiplexer.

Another embodiment provides an electronic system comprising: at least three identical electronic devices, each comprising at least one chain of test data, comprising: the comparison device described above.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings, in which.

DETAILED DESCRIPTION

Figure 1:
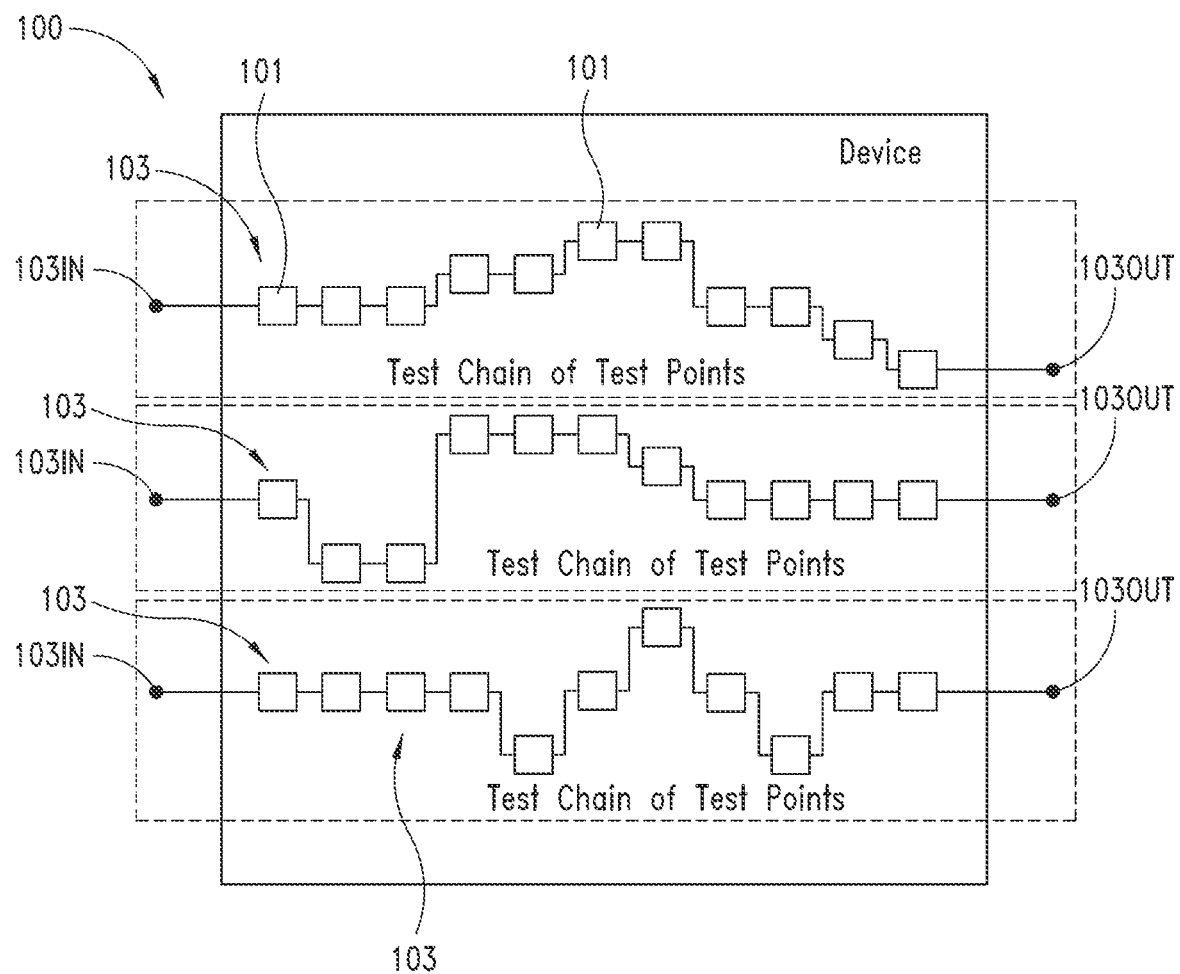
FIG. 1 schematically shows in the form of blocks an electronic device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, or of plus or minus 5%, of the value in question.

FIG. 1 schematically shows in the form of blocks an electronic device 100. Electronic device 100 is for example a processor, a microprocessor, an integrated system, a control unit, a memory, etc.

Electronic device 100 comprises a plurality of test points 101. Each test point 101 stores functional data, used during the execution of the device, and called test data during a test phase. Test points 101 are for example arranged in device 100 on design thereof and are each associated with one or a plurality of circuits or units or components of device 100. The test data stored in a test point 101 are data providing an indication relative to the state of one or a plurality of components having test point 101 associated therewith. As an example, a test point 101 is a register, or one or more flip-flops. The test data are for example a binary word coded over N bits. As an example, N is in the range from 1 to 64 bits, for example, equal to 1. As an example, the test points all comprise binary words of same sizes. According to another example, certain test points 101 comprise binary words of different sizes. In another example, a test point 101 may comprise a binary word, or signature (MISR, Multiple Input Signature Register), reflecting the state of a memory.

The test points 101 are organized in one or a plurality of test chains 103. Each test chain 103 comprises an input node 103IN and an output node 103OUT.

Device 100 may comprise as many test points as desired, organized in as many test chains as desired. Test chains 103 may all have the same number of test points 101 but may as a variation have different numbers of test points 101. As an example, device 100 illustrated in FIG. 1 for example comprises thirty-three test points 101 organized in three test chains 103, each comprising eleven test points 101.

A phase of error, or faults, detection or test of device 100 generally comprises reading and comparing all the test data stored in the test points. The number of test points 101 comprised within test chain 103 thus has an influence on the duration of a test phase. Indeed, the more test chain 103 comprises test points 101, the longer the test phase. The organization of test points 101 in test chains 103 may enable to shorten this time period by enabling to read a plurality of test points 101 in parallel.

A device and a method of error detection and correction in device 100 will be described in relation with FIGS. 2 and 3.

Figure 2:
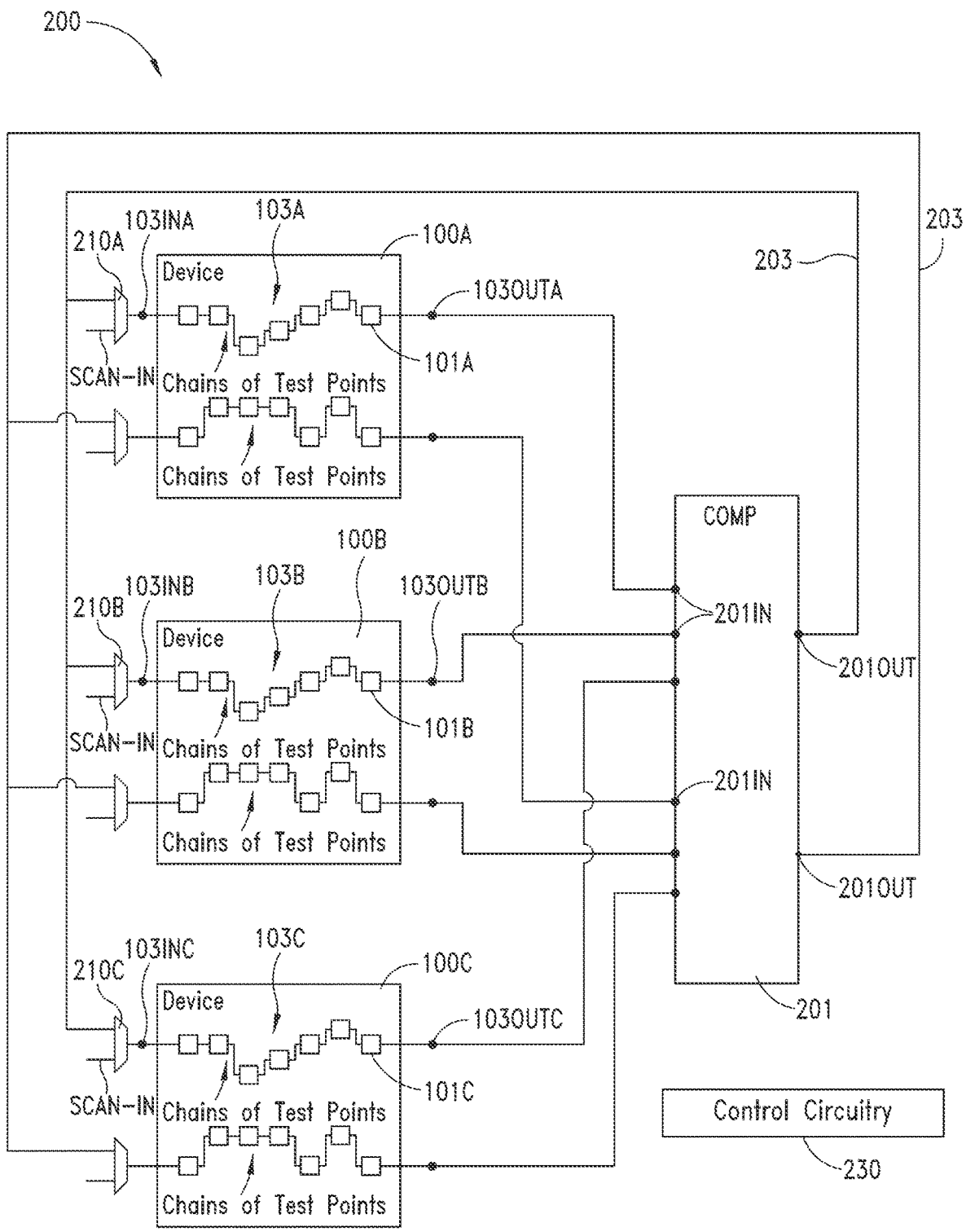
FIG. 2 very schematically shows in the form of blocks an embodiment of a device of error detection and correction in electronic devices of the type of the device of FIG. 1.

FIG. 2 schematically shows in the form of blocks an embodiment of a device 200 of error detection and correction by comparison, or device of comparison, of three devices 100A, 100B, and 100C of the type of device 100 described in relation with FIG. 1. Devices 100A, 100B, and 100C may be identical, for example, identical in their structure but also have implemented the same operations and should be characterized by identical test data.

According to an embodiment, each device 100A, respectively 100B, 100C, comprises test chains 103A, respectively 103B, 103C, comprising test points 101A, respectively 101B, 101C. Each test chain 103A, respectively 103B, 103C, comprises an input 103INA, respectively 103INB, 103INC and an output 103OUTA, respectively 103OUTB, 103OUTC. Devices 100A, 100B, 100C being identical in their structure, they each comprise the same test chains 103A, 103B, 103C.

In the case illustrated in FIG. 2, each device 100A, 100B, 100C comprises two test chains 103A, 103B, 103C, each comprising seven test points 101A, 101B, 101C. Devices 100A, 100B, and 100C comprise two sets of similar test chains 103A, 103B, 103C.

Comparison device 200 comprises a comparator circuit 201 (COMP) comprising as many inputs 201N as the total number of test chains of devices 100A, 100B, and 100C, and as many outputs 201OUT as test chains in a device 100A, 100B, or 100C. Comparator circuit 201 is capable of receiving as an input the outputs 103OUTA, 103OUTB, and 103OUTC of all the test chains 103A, 103B, and 103C of devices 100A, 100B, and 100C, and of outputting as many signals as the number of sets of similar test chains 103A, 103B, 103C. In the case illustrated in FIG. 2, comparator circuit 201 comprises six inputs 201N and two outputs 201OUT.

Comparison device 200 further comprises as many feedback loops 203 as test chains in a device 100A, 100B, or 100C. Each feedback loop 203 couples an output 201OUT of comparator circuit 201 to an input 103INA, 103INB, 103INC of a test chain 103A, 103B, 103C. Further, each feedback loop 203 couples an output 201OUT to an input 103INA, respectively 103INB, 103INC, via, for example, a multiplexer 210A, respectively 210B, 210C. Each multiplexer 210A, 210B, 210C, comprises at least two inputs, one coupled to one of feedback loops 203, the other receiving a signal SCAN-IN, and comprises at least one output coupled to an input 103INA, 103INB, 103INC of a test chain 103A, 103B, 103C. Each feedback loop 203 further couples, via multiplexers 210A, 210B, 210C, all the inputs 103INA, 103INB, 103INC of the similar test chains 103A, 103B, 103C of devices 100A, 100B, 100C. These multiplexers 210A, 210B, and 210C, are used to distinguish data coming from the feedback loop 203 during the test phase, and other data used during test phases using test protocol different from the one the present embodiment. As illustrated, comparison device 200 comprises control circuitry 230, which in operation, controls multiplexers 210A, 210B, and 210C, generates error and reset signals, etc., such as discussed herein with reference to FIG. 3.

The operation of device 200 will be described in relation with FIG. 3.

Figure 3:
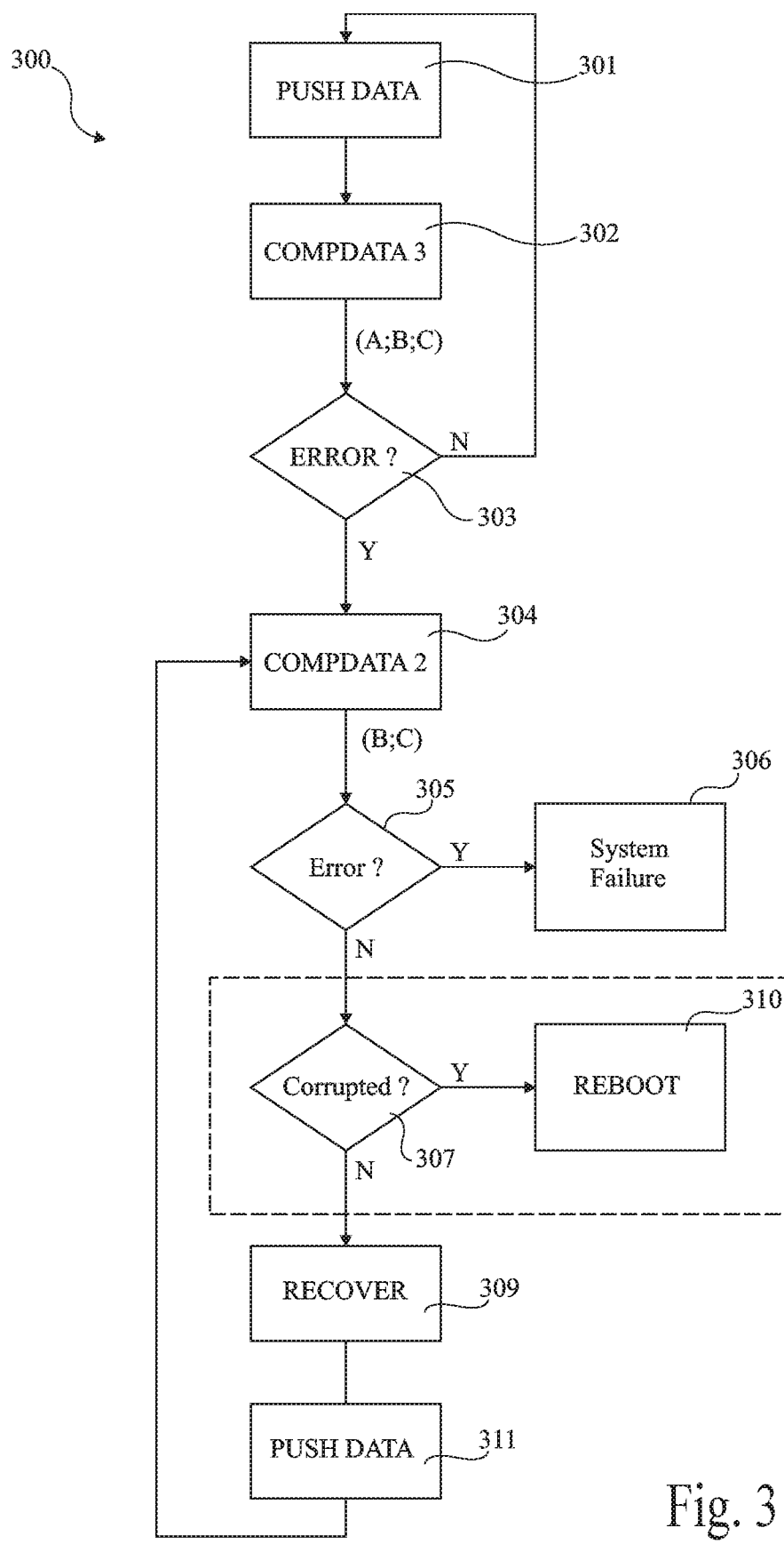
FIG. 3 is a flowchart illustrating an example of the operation of the embodiment of FIG. 2.

FIG. 3 is a flowchart 300 illustrating an example of the operation of device 200 of FIG. 2.

At a step 301 (PUSH), all the test data contained on test points 101A, 101B, 101C, are shifted towards the next test point 101A, 101B, 101C in their respective test chain 103A, 103B, 103C. The test data stored in the last test point 101A, 101B, 101C, of all the test chains 103A, 103B, 103C, are sent onto the inputs 201IN of comparator circuit 201.

At a step 302 (COMPDATA3), comparator circuit 201 compares the data that it has received with one another. More particularly, comparator circuit 201 compares with one another data from devices 100A, 100B, 100C, originating from similar test chains 103A, 103B, 103C. In other words, comparator circuit 201 compares with one another three pieces of data which should be identical.

At a step 303 (Error?), comparator circuit 201 detects whether one of the three pieces of data in a set of similar test chains 103A, 103B, 103C that it compares is different from the two others.

If the three pieces of data are identical (Output N), the next step is step 301. Comparator circuit 201 then compares the next test data of test chains 103A, 103B, 103C.

If one of the three pieces of data, called data A, is different from the two others, called data B and C (output Y), the next step is a step 304 (COMPDATA2). The device 100A is then considered as faulty and is not used anymore during the test phase.

At step 304, data B and C are compared with each other by comparator circuit 201.

At a step 305 (Error?), comparator circuit 201 detects whether data B and C are identical or different.

If data B and C are different from each other (output Y), this means that the three pieces of data A, B, and C of devices 100A, 100B, 100C are different from one another. In this case, the next step is a step 306 (System Failure).

At step 306, device 200 for example enters a default mode, and devices 100A, 100B, and 100C for example stop operating. As an example, an error report may be established based on data A, B, and C and may be communicated to a central processing unit or to a user of devices 103A, 103B, 103C.

If data B and C are identical (Output N), the next step is an optional step 307 (Corrupted?) or a step 309 (RECOVER).

At optional step 307, comparator circuit 201 establishes, for example, whether one of devices 100A, 100B, 100C is defective or corrupted, for example, according to data A, B, and C. The optional step 307 is, for example, added if the test points of devices 100A, 100B, and 100C, are not formed by flip flops, as an example, when the devices are DRAM (Dynamic Random Access Memory) or SRAM (Static Random Access Memory) type memory.

If one or a plurality of devices 100A, 100B, 100C, is recognized as being defective or corrupted (OUTPUT Y), the next step is a step 310 (REBOOT) where the concerned device(s) are, for example, reset. In fact, test data may be a binary word, or a signature, reporting malfunction of one of the devices 100A, 100B, and 100C.

If devices 100A, 100B, 100C, are not recognized as being defective (Output N), then the next step is step 309.

At step 309, comparator circuit 201 outputs output data S equal to identical data B and C. Output data S are considered as the correct data with which data A of the last test point 101A are to be replaced. Data S are sent by the appropriate feedback loop 203 and written into the first test points 101A, 101B, and 101C of the test chains 103A, 103B, 103C from which data A, B, and C originate. The incorrect test data A are then corrected. The step following step 309 is step 311 identical to the step 301 described above. More precisely, in step 311, all the test data contained on test points 101A, 101B, 101C, are shifted towards the next test point 101A, 101B, 101C in their respective test chain 103A, 103B, 103C. Step 311 is followed by the step 304 described above. In fact, device 100A having been recognized as faulty, only device 100B and 100C test data are compared. The comparison method is repeated until all the test data of all the test chains 103B, and 103C are compared and until all the test data of all the test chains 103A are corrected.

An advantage of an embodiment of the error detection and correction method and of the device implementing it, described in relation with FIGS. 2 and 3, is that they may be applied to any device of the type of device 100 described in relation with FIG. 1, independently from the operation thereof.

Another advantage of the method and of the device of FIGS. 2 and 3 is that they may facilitate detecting different types of errors. More particularly, they may facilitate detecting errors without observing the operation of devices 100A, 100B, 100C or the general operation of the system to which they belong. Detection device 200 also may facilitate detecting errors (SPF, Single point Fault) having a direct influence on the operation as well as errors (LFM, Latent Fault Metric) which have no immediate influence on the operation of devices 100A, 100B, and 100C.

Another advantage is that an embodiment of comparison device 200 does not require the implementation of a memory storing all the test data of test chains 103A, 103B, 103C of devices 100A, 100B, 100C to compare them with one another.

Another advantage of an embodiment of comparison device 200 is that it is easy to implement in a system comprising electronic devices of the type of device 100 described in relation with FIG. 1, since it comprises a single comparison circuit, feedback loops, and multiplexers.

Various embodiments and variations have been described. It will be understood by those skilled in the art that certain features of these various embodiments and variations may be combined, and other variations will occur to those skilled in the art. In particular, error detection and correction device 200 may be adapted to compare more than three devices of the type of device 100 described in relation with FIG. 1.

Finally, the practical implementation of the described embodiments and variations is within the abilities of those skilled in the art based on the functional indications given hereabove.

Some embodiments may take the form of or comprise computer program products. For example, according to one embodiment there is provided a computer readable medium comprising a computer program adapted to perform one or more of the methods of functions described herein. The medium may be a physical storage medium, such as for example a Read Only Memory (ROM) chip, or a disk such as a Versatile Disk (DVD-ROM), Compact Disk (CD-ROM), a hard disk, a memory, a network, or portable media article to be read by an appropriate drive or via an appropriate connection, including as encoded in one or more barcodes or other related codes stored on one or more such computer-readable mediums and being readable by an appropriate reader device.

In some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including micro controllers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    testing at least three devices, each device including a test chain having a plurality of positions storing test data, the testing including:
        detecting errors by:
            comparing test data in a last position of the test chain of each of the devices; and
            shifting test data in the test chains of each of the devices;
        and correcting errors by storing a result of the comparison in a first position of the test chains of each of the devices; and
        repeating the comparing and the shifting and storing until all the stored test data has been compared.

2. The method of claim 1, comprising storing pieces of test data in test points.

3. The method of claim 2, wherein the test points are registers or flip-flops.

4. The method of claim 2, wherein the test data comprises binary words.

5. The method of claim 1, wherein the test data comprises binary words, each binary word having a same size.

6. The method of claim 1, wherein the test data comprises binary words of different sizes.

7. The method of claim 1, wherein the devices each comprise a plurality of test chains.

8. The method of claim 1, comprising testing more than three devices.

9. The method of claim 1, wherein the at least three devices have a same structure and a same function.

10. The method of claim 1, wherein the result of the comparison is a value stored in the last position of a test chain of two or more of the at least three devices prior to the shifting.

11. The method of claim 1, comprising:
    responding to the result of the comparison indicating an error in one of the at least three devices by disregarding test results from the one of the at least three devices in subsequent comparisons.

12. The method of claim 11, comprising:
    responding to a result of a subsequent comparison indicating the test data is different by generating an indication of a system failure.

13. A device, comprising:
    a comparator; and
    control circuitry coupled to the comparator, wherein the control circuitry, in operation, controls detecting and correcting of errors of at least three electronic circuits, each electronic circuit including a test chain having a plurality of positions storing test data, the detecting and correcting including:
        comparing test data in a last position of the test chain of each of the electronic circuits; and
        shifting test data in the test chains of each of the electronic circuits and storing a result of the comparison in a first position of the test chains of each of the electronic circuits, wherein the comparing and the shifting and storing are repeated until all the stored test data has been compared.

14. The device of claim 13, wherein the control circuitry comprises at least three feedback loops, each coupling an output of the comparator and an input of the test chain of one of the three electronic circuits.

15. The device of claim 14, wherein each feedback loop comprises a multiplexer.

16. The device of claim 13, wherein the control circuitry, in operation:
    responds to the result of the comparison indicating an error in one of the at least three electronic circuits by disregarding test results from the one of the at least three electronic circuits in subsequent comparisons; and
    responds to a result of a subsequent comparison indicating the test data is different by generating an indication of a system failure.

17. A system, comprising:
    at least three electronic devices, each including a test chain having a plurality of positions storing test data; and
    testing circuitry coupled to the at least three electronic devices, wherein the testing circuitry, in operation, detects and corrects errors of the at least three electronic devices, the detecting and correcting including:

comparing test data in a last position of the test chain of each of the at least three electronic devices; and shifting test data in the test chains of each of the at least three electronic devices and storing a result of the comparison in a first position of the test chains of each of the devices, wherein the comparing and the shifting and storing are repeated until all the stored test data has been compared.

18. The system of claim 17, wherein the test chains comprise test points, which, in operation, store test data.

19. The system of claim 18, wherein the test points are registers or flip-flops.

20. The system of claim 17, wherein the test data comprises binary words.

21. The system of claim 17, wherein the test data comprises binary words, each binary word having a same size.

22. The system of claim 17, wherein the test data comprises binary words of different sizes.

23. The system of claim 17, wherein the electronic devices each comprise a plurality of test chains.

24. The system of claim 17, wherein the at least three electronic devices have a same structure and a same functionality.

25. The system of claim 17, wherein the testing circuitry comprises a comparator and a plurality of feedback loops coupling one or more outputs of the comparator to inputs of the testing chains.

26. The system of claim 17, wherein the result of the comparison is a value stored in the last position of a test chain of two or more of the at least three devices prior to the shifting.

27. The system of claim 17, wherein the testing circuitry, in operation, responds to the result of the comparison indicating an error in one of the at least three electronic devices by disregarding test results from the one of the at least three electronic devices in subsequent comparisons.

28. The system of claim 27, wherein the testing circuitry, in operation, responds to a result of a subsequent comparison indicating the test data is different by generating an indication of a system failure.

* * * * *